United States Patent
Choi et al.

(10) Patent No.: US 7,821,865 B2
(45) Date of Patent: Oct. 26, 2010

(54) NONVOLATILE MEMORY DEVICE USING VARIABLE RESISTIVE ELEMENTS

(75) Inventors: Byung-gil Choi, Yongin-si (KR); Beak-hyung Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 382 days.

(21) Appl. No.: 12/003,442

(22) Filed: Dec. 26, 2007

(65) Prior Publication Data

US 2008/0158941 A1 Jul. 3, 2008

(30) Foreign Application Priority Data

Dec. 27, 2006 (KR) .................. 10-2006-0135587

(51) Int. Cl.
*G11C 8/00* (2006.01)
(52) U.S. Cl. .................. 365/230.03; 365/163; 365/46
(58) Field of Classification Search .................. 365/46, 365/163, 230.03
See application file for complete search history.

(56) References Cited

U.S. PATENT DOCUMENTS

2003/0103398 A1* 6/2003 Van Tran .................. 365/206
2005/0185445 A1* 8/2005 Osada et al. .................. 365/148
2005/0243628 A1 11/2005 Kasai et al.
2006/0034141 A1* 2/2006 Iioka et al. .................. 365/230.03

FOREIGN PATENT DOCUMENTS

| JP | 11-110964 A | 4/1999 |
|---|---|---|
| JP | 2004-164766 | 6/2004 |
| JP | 2006-4479 | 1/2006 |
| JP | 2006-019009 A | 1/2006 |
| JP | 2006-79756 | 3/2006 |
| KR | 10-2006-0047467 | 5/2006 |

OTHER PUBLICATIONS

Korean Notice of Allowance corresponding to counterpart Korean Application No. 10-2006-0135587 dated Dec. 4, 2008.
Office Action for Korean Application No. 10-2006-0135587 dated Jun. 23, 2008.

* cited by examiner

*Primary Examiner*—Hoai V Ho
*Assistant Examiner*—Jason Lappas
(74) *Attorney, Agent, or Firm*—Harness, Dickey & Pierce (57) ABSTRACT

The nonvolatile memory device includes a plurality of memory banks, each of which includes a plurality of nonvolatile memory cells. Each cell includes a variable resistive element having a resistance varying depending on stored data. A plurality of global bit lines are included, and each global bit line is shared by the plurality of memory banks. A plurality of main word lines are arranged corresponding to one of the plurality of memory banks.

19 Claims, 12 Drawing Sheets

NONVOLATILE MEMORY DEVICE USING VARIABLE RESISTIVE ELEMENTS

PRIORITY STATEMENT

This application claims priority from Korean Patent Application No. 10-2006-0135587 filed on Dec. 27, 2006 in the Korean Intellectual Property Office, the disclosure of which is incorporated herein by reference in its entirety.

BACKGROUND OF THE INVENTION

1. Field

Example embodiments of the present invention relate to a nonvolatile memory device using variable resistive elements.

2. Description of the Related Art

Nonvolatile semiconductor memory devices using a resistance material are classified as NOR flash memory devices, NAND flash memory devices, phase change random access memory (PRAM) devices, and others. Whereas, dynamic random access memory (DRAM) devices or flash memory devices write data using charges, phase-change random access memories (PRAMs) store data using a phase-change material, e.g., a chalcogenide alloy, which goes into a crystalline state or an amorphous state due to a change in temperature by cooling followed by heating.

In other words, since the resistance of a phase-change material in the more crystalline state is low and the resistance of an amorphous phase-change material is high, the crystalline state is referred to as a set or "0" state and the amorphous state is referred to as a reset or "1" state. PRAM devices write data by using joule heat, which is generated by applying a set pulse or a reset pulse to a phase change material. In detail, data is written to a PRAM cell either by heating a phase change material of the PRAM cell to higher than its melting point using a reset pulse, and quickly cooling down the phase change material so that the state of the phase change material is changed into an amorphous state, or by heating the phase change material to lower than its crystallization point, maintaining the resulting temperature for a predetermined amount of time, and cooling down the phase change material so that the state of the phase change material is changed into a crystalline phase.

Figure 1:
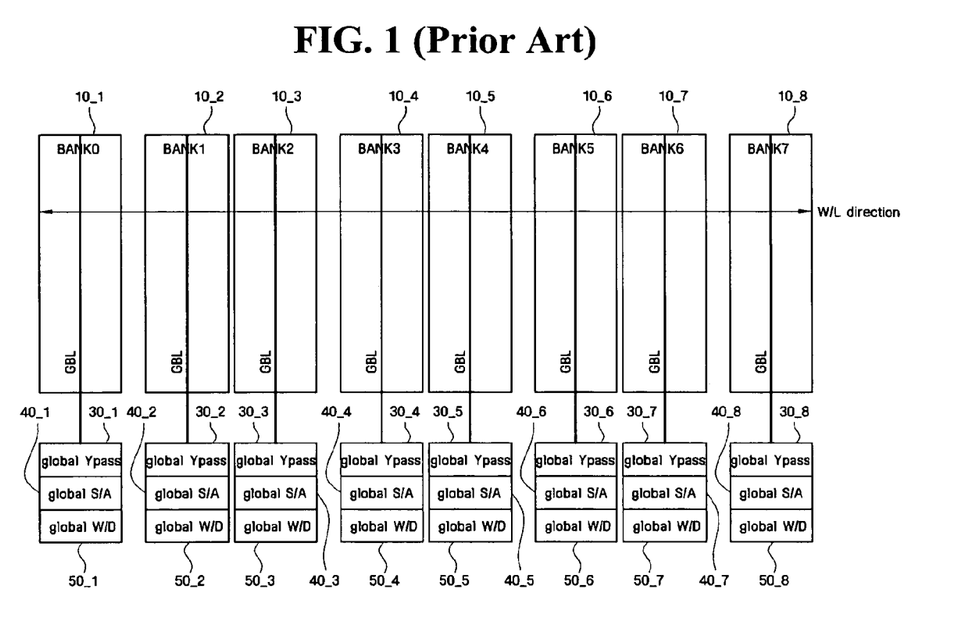
FIGS. 1 and 2 are circuit diagrams for explaining the arrangement of a conventional nonvolatile memory device.
Figure 2:
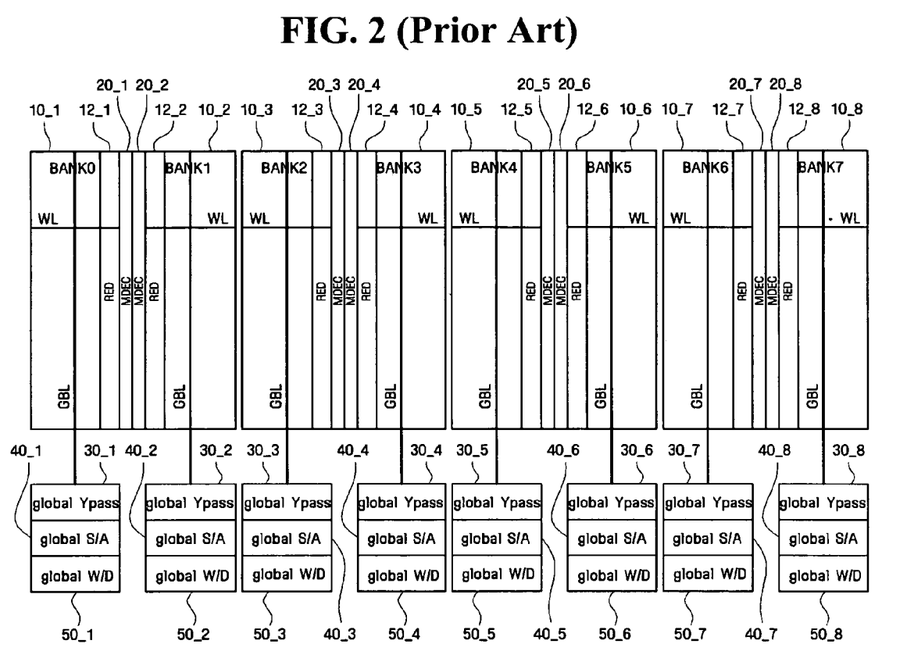

FIGS. 1 and 2 are circuit diagrams for explaining the arrangement of a conventional nonvolatile memory device. For explanatory convenience, FIGS. 1 and 2 show that the conventional nonvolatile memory device includes eight memory banks, but it may contain a different number of memory banks.

Referring to FIG. 1, the conventional nonvolatile memory device includes a plurality of memory banks 10_1 through 10_8, global column select circuits 30_1 through 30_8, global sense amplifier (amp) circuits 40_1 through 40_8, and/or global write driver circuits 50_1 through 50_8. A nonvolatile memory device with higher capacity and higher integration density can be implemented using a hierarchical bit line structure in which a plurality of local bit lines are connected to each of the global bit lines and a hierarchical word line structure in which a plurality of sub word lines are coupled to each of main word lines. As illustrated in FIG. 1, a global bit line GBL is arranged corresponding to each of the plurality of memory banks 10_1 through 10_8. A main word line direction is arranged corresponding to the plurality of memory banks 10_1 through 10_8.

When the global bit line GBL is arranged corresponding to each of the plurality of memory banks 10_1 through 10_8, the conventional nonvolatile memory device has a core architecture as illustrated in FIG. 2. Referring to FIG. 2, a plurality of main word line decoders 20_1 through 20_8 and a plurality of redundancy memory cell arrays 12_1 through 12_8 are arranged corresponding to the plurality of memory banks 10_1 through 10_8.

The conventional nonvolatile memory device having the core architecture illustrated in FIG. 2 requires a considerable increase in the number of sense amps within the global sense amp circuits 40_1 through 40_8 depending on the number of words being pre-fetched during a synchronous burst read operation. For example, if the number of words to be read and pre-fetched from one memory bank (e.g., 10_1) is 4, the number of sense amps needed within one global sense amp circuit (e.g., 40_1) is 64 (1 word (16 bits)×4). Thus, 512 (64×8) sense amps are needed within the 8 global sense amp circuits 40_1 through 40_8. If 8 words are pre-fetched from one memory bank, 1,024 sense amps are needed. If 16 words are pre-fetched from one memory bank, 2,048 sense amps are needed. That is, as the number of words to be pre-fetched increases, the area of the core architecture increases.

It is also difficult to write a large number of bits of data within one memory bank (e.g., 10_1) during a test operation. Assuming that the reset current flowing through one nonvolatile memory cell is about 1 mA when reset data is written to one nonvolatile memory cell, a reset current of about 16 mA may be required to write 16-bits of data into the memory bank 10_1 at a time. That is, because an excessively high level of reset current flows within the memory bank 10_1 (the narrow space), a large number of bits of data are difficult to write at a time. Thus, a large amount of test time is required because a small number of bits of data should be written at a time during a test operation Still further, the area of the core architecture increases because the plurality of main word line decoders 20_1 through 20_8 are arranged corresponding to the plurality of memory banks 10_1 through 10_8. The area of the core architecture can be further increased because the plurality of redundancy memory cell arrays 12_1 through 12_8 are arranged corresponding to the plurality of memory banks 10_1 through 10_8 because nonvolatile memory cells in the memory banks 10_1 through 10_8 and redundancy memory cells within the redundancy memory cell arrays 12_1 through 12_8 share the same word line WL.

SUMMARY

The present invention relates to a nonvolatile memory device and a method of forming the same.

The nonvolatile memory device includes a plurality of memory banks, each of which includes a plurality of nonvolatile memory cells. Each cell includes a variable resistive element having a resistance varying depending on stored data. A plurality of global bit lines are included, and each global bit line is shared by the plurality of memory banks. A plurality of main word lines are arranged corresponding to one of the plurality of memory banks.

BRIEF DESCRIPTION OF THE DRAWINGS

The above and other features and advantages of the present invention will become more apparent by describing in detail example embodiments thereof with reference to the attached drawings in which.

DETAILED DESCRIPTION OF THE INVENTION

Advantages and features of the present invention and methods of accomplishing the same may be understood more readily by reference to the following detailed description of example embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element or layer is referred to as being "connected to" or "coupled to" another element, it can be directly connected or coupled to the other element or layer, or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

Although example embodiments will be described below in different sections or separately on an embodiment-by-embodiment basis, the descriptions are not irrelevant to each other unless otherwise specified. They are, in whole or in part, variations of each other and sometimes one description is a detailed or supplementary form of another. In the example embodiments described below, even when a specific numerical figure (quantity, numerical value, amount, range, etc.) is indicated for an element, it is not limited to the indicated specific numerical figure unless otherwise specified or theoretically limited to the specific numerical figure; it should be understood that it may be larger or smaller than the specific numerical figure. In the embodiments described below, elements (including element steps) are not always essential unless otherwise specified or clearly considered essential. Likewise, when a shape or position of an element is indicated in the embodiments described below, it is considered that a shape or position which is virtually equal or similar to it is also included, unless otherwise specified or clearly considered not so. This holds true of numerical figures and ranges as mentioned above. In all the drawings that illustrate example embodiments, elements with like functions are designated by like reference numerals; and descriptions of these elements are not repeated.

It will be understood that, although the terms first, second, and others may be used herein to describe various elements, these elements should not be limited by these terms. These terms are only used to distinguish one element from another element. Thus, a first element discussed below could be termed a second element without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, exemplary embodiments of the present invention will be described with regard to a PRAM. However, it will be apparent to those skilled in the art that the invention can also be applied to nonvolatile semiconductor memory devices using a resistance material such as a phase-change RAM (PRAM), a magnetic RAM (MRAM), or the like.

Figure 3:
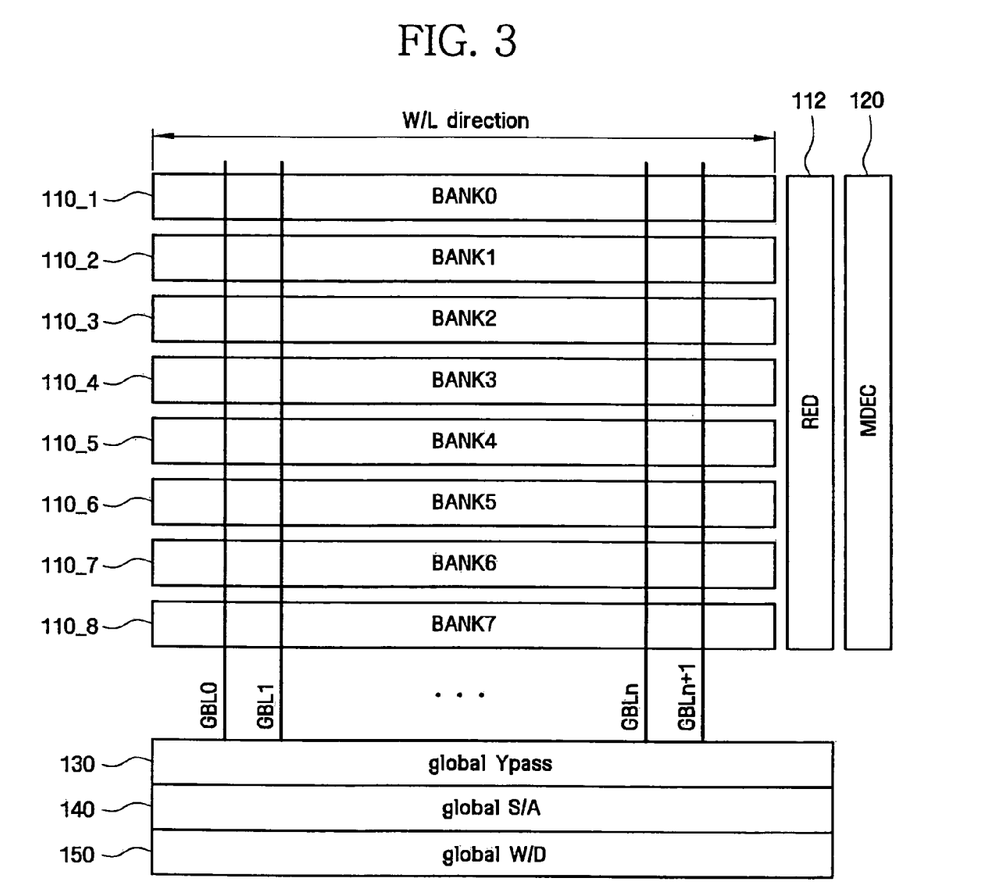
FIG. 3 is a block diagram for explaining nonvolatile memory devices according to embodiments of the present invention.

FIG. 3 is a block diagram for explaining nonvolatile memory devices according to embodiments of the present invention. For explanatory convenience, FIG. 3 shows that the nonvolatile memory device has eight memory banks, but it may contain a different number of memory banks.

Referring to FIG. 3, the nonvolatile memory device includes a plurality of memory banks 110_1 through 110_8, a global column select circuit 130, a global sense amplifier (amp) circuit 140 and/or global write driver circuit 150, a redundancy memory cell array 112, and a main word line decoder 120.

Although not shown in FIG. 3, each of the memory banks 110_1 through 110_8 includes a plurality of nonvolatile memory cells, each of which includes a variable resistive element having a resistance varying depending on stored data and an access element controlling current flowing through the variable resistive element. The variable resistive element may be composed of various kinds of materials such as a binary (two-element) compound (e.g., GaSb, InSb or InSe), a ternary (three-element) compound (e.g., GeSbTe, GaSeTe, InSbTe, $SnSb_2Te_4$ or InSbGe), or a quaternary (four-element) compound (e.g., AgInSbTe, (GeSn)SbTe, GeSb (SeTe) or $Te_{81}Ge_{15}Sb_2S_2$). The most commonly used material is GeSbTe. The access element may include a diode, a field-effect (FET) transistor, an NPN bipolar transistor, a PNP bipolar transistor or another semiconductor device.

A higher capacity, higher integration density nonvolatile memory device can be implemented using a hierarchical bit line structure in which a plurality of local bit lines are connected to each of the global bit lines and a hierarchical word line structure in which a plurality of sub word lines are coupled to each of the main word lines. Referring to FIG. 3, each of a plurality of global bit lines GBL0 through GBLn+1 is arranged corresponding to the plurality of memory banks 110_1 through 110_8. Each of a plurality of main word lines is provided corresponding to one of the plurality of memory banks 110_1 through 110_8.

The global sense amp circuit 140 is coupled with the plurality of global bit lines GBL0 through GBLn+1 and reads data from nonvolatile memory cells within the plurality of memory banks 110_1 through 110_8 through the plurality of global bit lines GBL0 through GBLn+1. The global write driver circuit 150 is coupled with the plurality of global bit lines GBL0 through GBLn+1 and writes data to the nonvolatile memory cells within the plurality of memory banks 110_1 through 110_8 through the plurality of global bit lines GBL0 through GBLn+1.

The main word line decoder 120 is coupled with the plurality of main word lines and selectively selects the plurality of main word lines, each provided corresponding to one of the plurality of memory banks 110_1 through 110_8. In this way, because the plurality of memory banks 110_1 through 110_8 share the main word line decoder 120 and the redundancy memory cell array 112, the area of the core architecture can be reduced.

Figure 4:
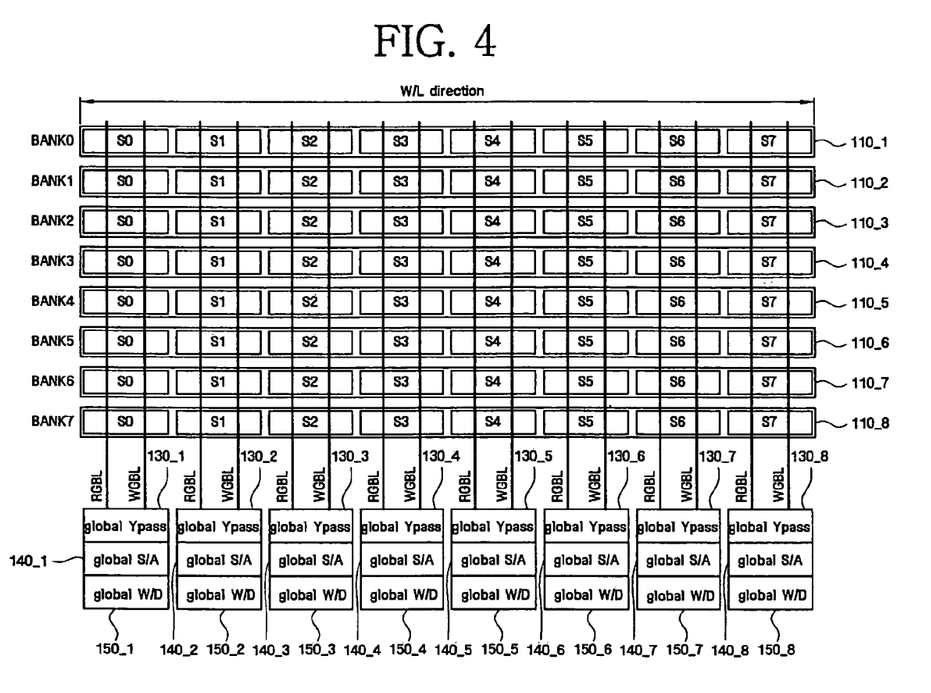
FIG. 4 is a block diagram of a nonvolatile memory device according to an embodiment of the present invention.

FIG. 4 is a block diagram of a nonvolatile memory device according to an embodiment of the present invention.

Referring to FIG. 4, each global bit line includes write global bit lines (WGBL) used to write data into the plurality of memory banks 110_1 through 110_8 and a read global bit line (RGBL) used to read data from the plurality of memory banks 110_1 through 110_8. The nonvolatile memory device having this configuration can easily perform a read operation during a write operation (i.e., read while write).

In the nonvolatile memory device according to the present embodiment, each of the plurality of memory banks 110_1 through 110_8 is divided into a plurality of sub-blocks S0 through S7. The global sense amp circuit (e.g., 140 of FIG. 3) includes first through eighth sense amp circuits 140_1 through 140_8 respectively corresponding to the plurality of sub-blocks S0 through S7. The global write driver circuit (e.g., 150 of FIG. 3) includes first through eighth global write driver circuits 150_1 through 150_8 respectively corresponding to the plurality of sub-blocks S0 through S7. The global column select circuit (e.g., 130 of FIG. 3) includes first through eighth global column select circuits 130_1 through 130_8 respectively corresponding to the plurality of sub-blocks S0 through S7.

Figure 5:
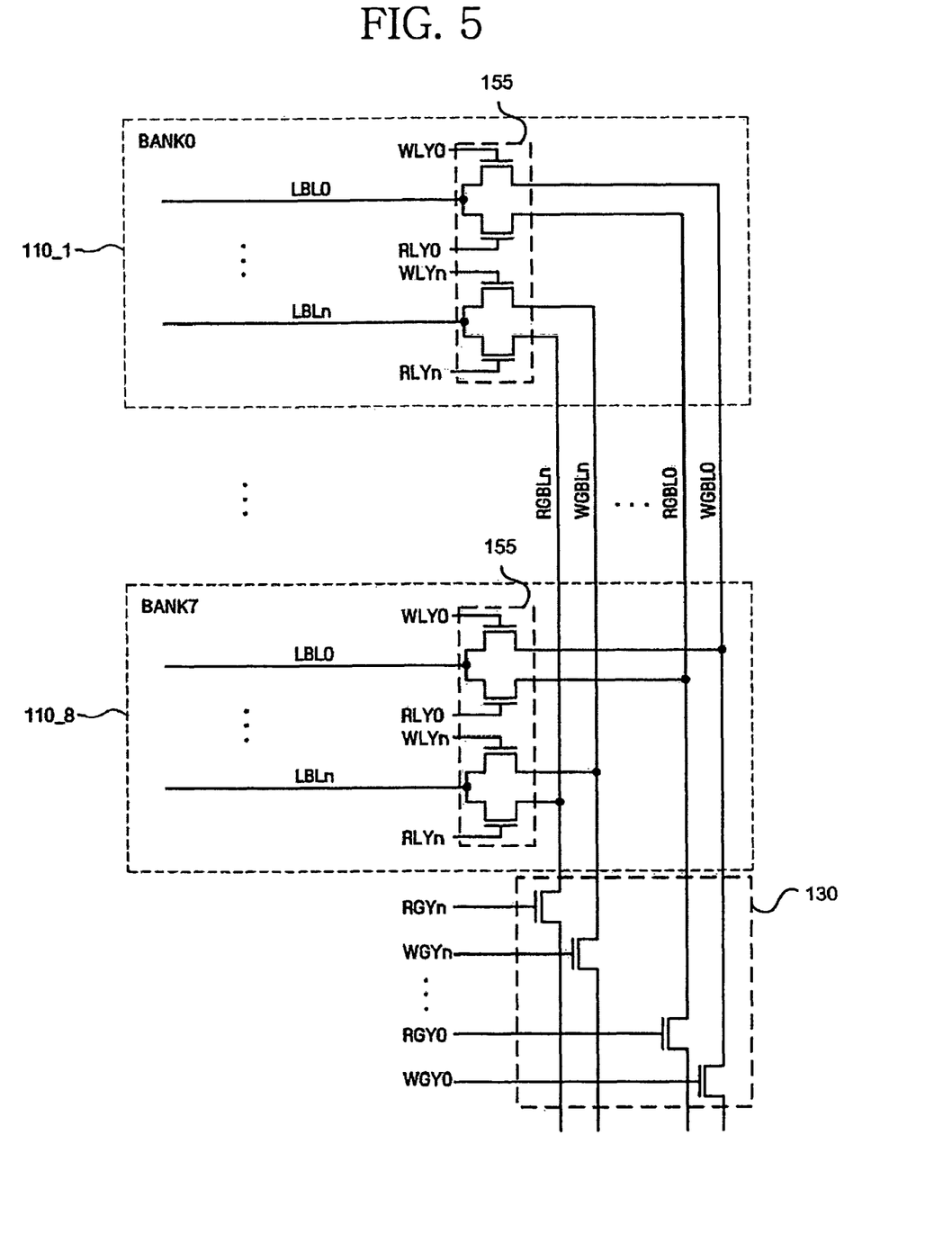
FIG. 5 is a conceptual circuit diagram for explaining in more detail the nonvolatile memory device of FIG. 4.

FIG. 5 is a conceptual circuit diagram for explaining in more detail the nonvolatile memory device of FIG. 4.

Referring to FIG. 5, the nonvolatile memory device includes a plurality of separate write global bit lines WGBL0 through WGBLn that are used during a write operation and a plurality of separate read global bit lines RGBL0 through RGBLn that are used during a read operation.

Thus, the global column select circuit 130 respectively selects the plurality of write global bit lines WGBL0 through WGBLn and the plurality of read global bit lines RGBL0 through RGBLn in response to write global column select signals WGY0 through WGYn and read global select signals RGY0 through RGYn. Namely, a selection transistor is disposed in each read global bit line RGBL0 through RGBLn and in each write global bit line WGBL0 through WGBLn. The selection transistors in the read global bit lines RGBL0 through RBGLn receive a respective one of the read global select signals RGY0 through RGYn at their gates, and the selection transistors in the write global bit lines WGBL0 through WGBLn receive a respective one of the write global column select signals WGY0 through WGYn at their gates.

A local column select circuit 155 selectively couples a plurality of local bit lines LBL0 through LBLn with the corresponding write global bit lines WGBL0 through WGBLn in response to write local column select signals WLY0 through WLYn. The local column select circuit 155 selectively couples the plurality of local bit lines LBL0 through LBLn with the corresponding read global bit lines RGBL0 through RGBLn in response to the read local column select signals RLY0 through RLYn. An exemplary configuration of the local column select circuit 155 will be described in detail later with reference to FIGS. 7A through 7D.

Figure 6:
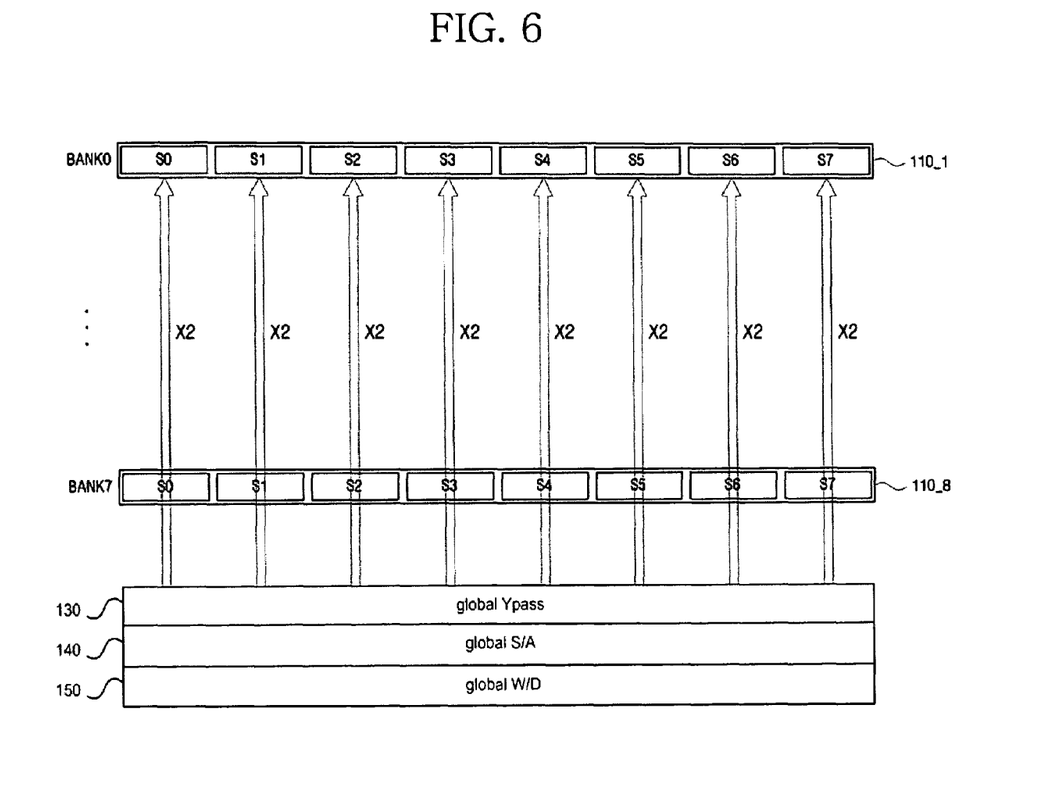
FIG. 6 is a conceptual diagram for explaining read and write operations of a nonvolatile memory device according to an embodiment of the present invention.

FIG. 6 is a conceptual diagram for explaining read and write operations of a nonvolatile memory device according to an embodiment of the present invention.

Referring to FIG. 6, the number of sense amps varies with the number of words to be pre-fetched during a synchronous burst read operation. For example, if the number of words to be read and pre-fetched from one memory bank is 4, the global sense amp circuit 140 requires 64 (1 word (16 bits)×4) sense amps. If 8 and 16 words are pre-fetched from one memory bank, the global sense amp circuit 140 may respectively contain 128 and 256 sense amps.

Further, in order to write n×m sets of data (n and m are integers greater than 1), the nonvolatile memory device according to the present embodiment can simultaneously write m sets of data into the n sub-blocks during a test operation.

For example, in order to write 16 (i.e. 8×2) sets of data into one memory bank (e.g., 110_1), two sets of data can be written into 8 sub-blocks simultaneously during the test operation, as illustrated in FIG. 6. During the normal operation, two sets of data can be repeatedly written 8 times in one sub-block (e.g., S0). That is, 16 sets of data can be written simultaneously during the test operation because write current is applied through a tester. The nonvolatile memory device repeatedly writes data into one sub-block during the normal operation due to a limitation on current driving ability, instead of simultaneously writing data into the plurality of sub-blocks S0 through S7. A nonvolatile memory device having sufficient current driving ability, however, may simultaneously write data into the plurality of sub-blocks during the normal operation. Because set/reset current can flow in the plurality of sub-blocks S0 through S7 (i.e., in a wide area), 16 sets of data can be written at a time during test operation. That is, because a large number of data can be written simultaneously during a test operation, the test time can be significantly reduced.

FIGS. 7A-7D are exemplary circuit diagrams of the local column select circuit 155.

Figure 7A:
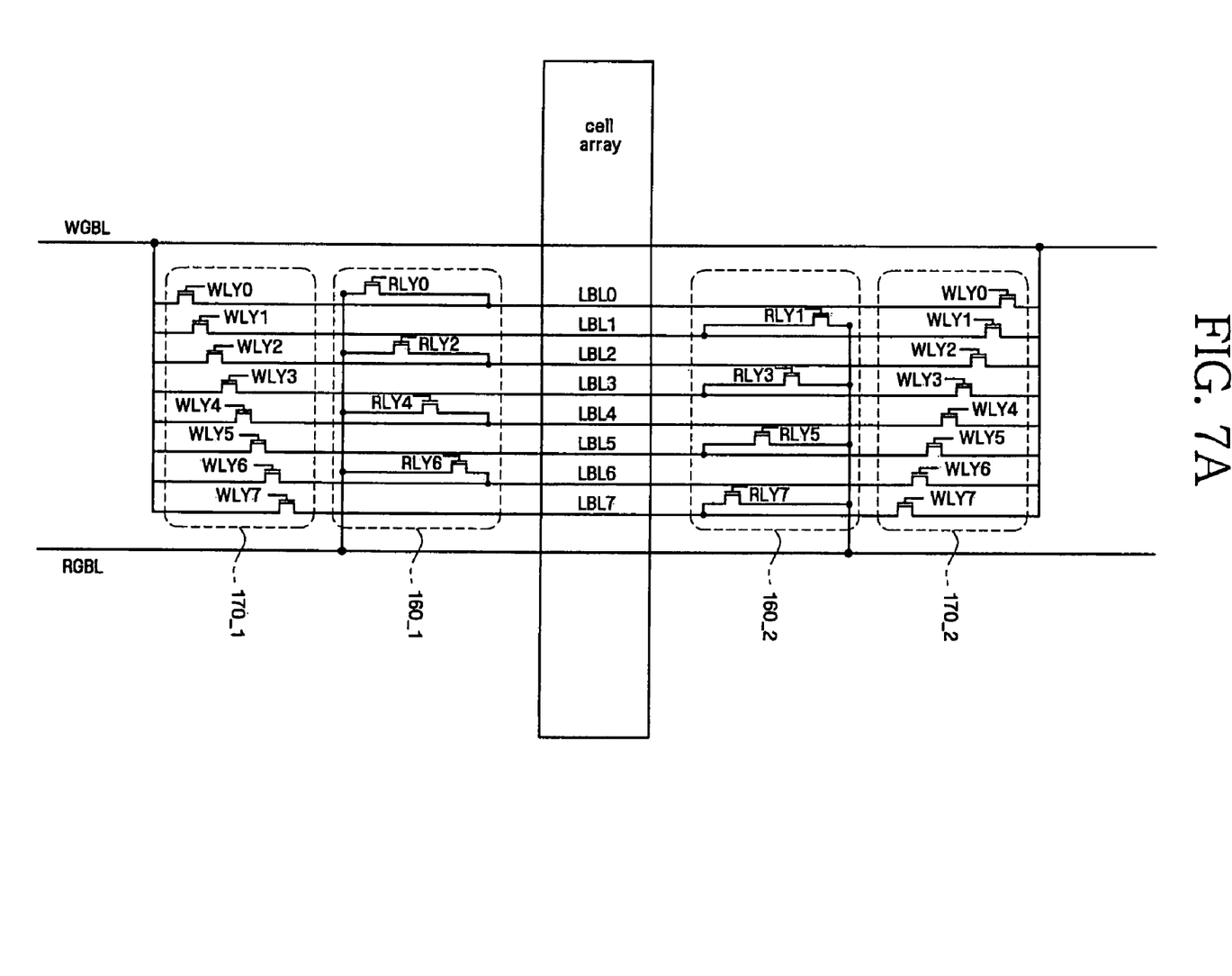
FIGS. 7A-7D are exemplary diagrams of the local column select circuit.
Figure 7B:
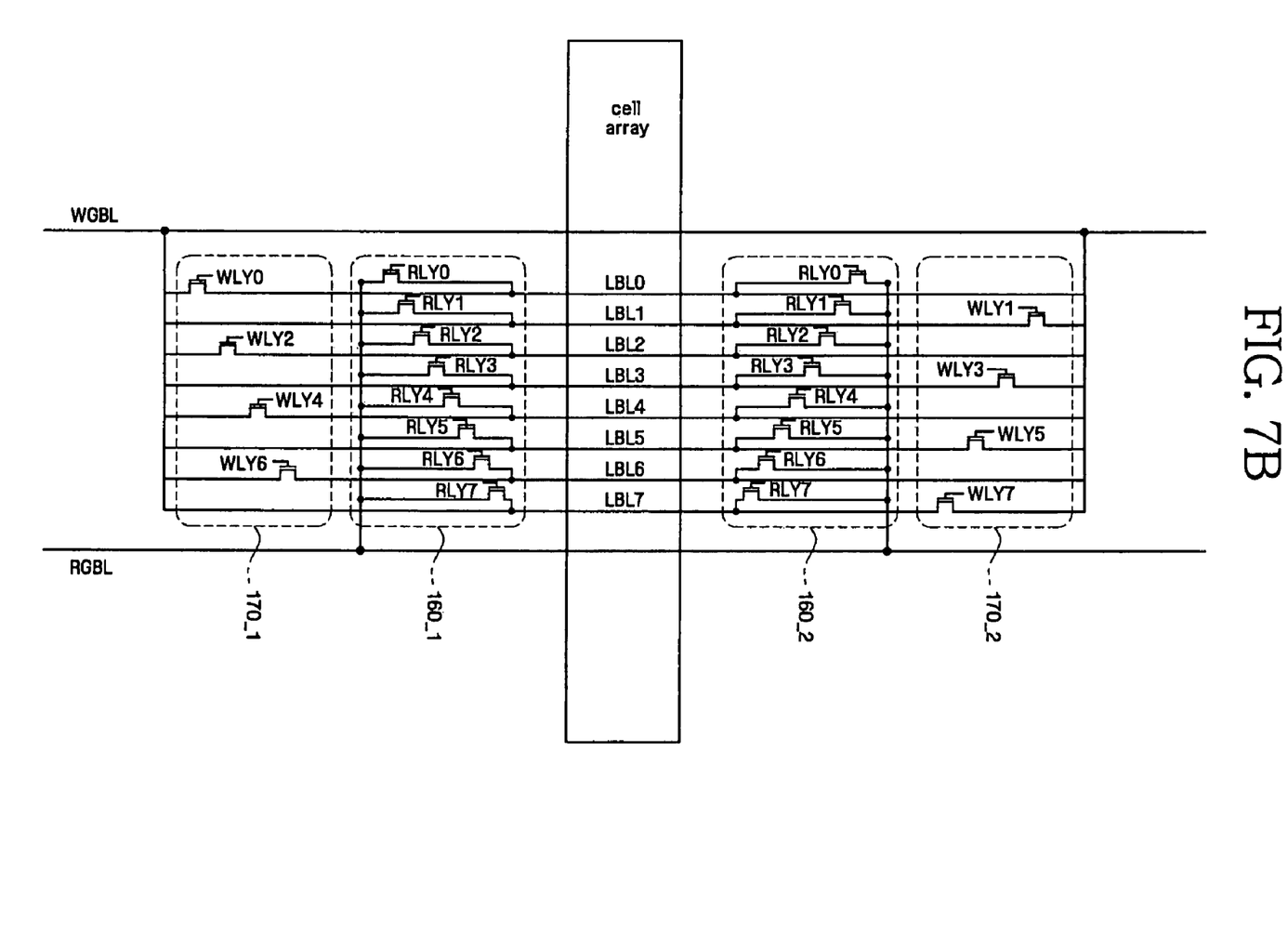
Figure 7C:
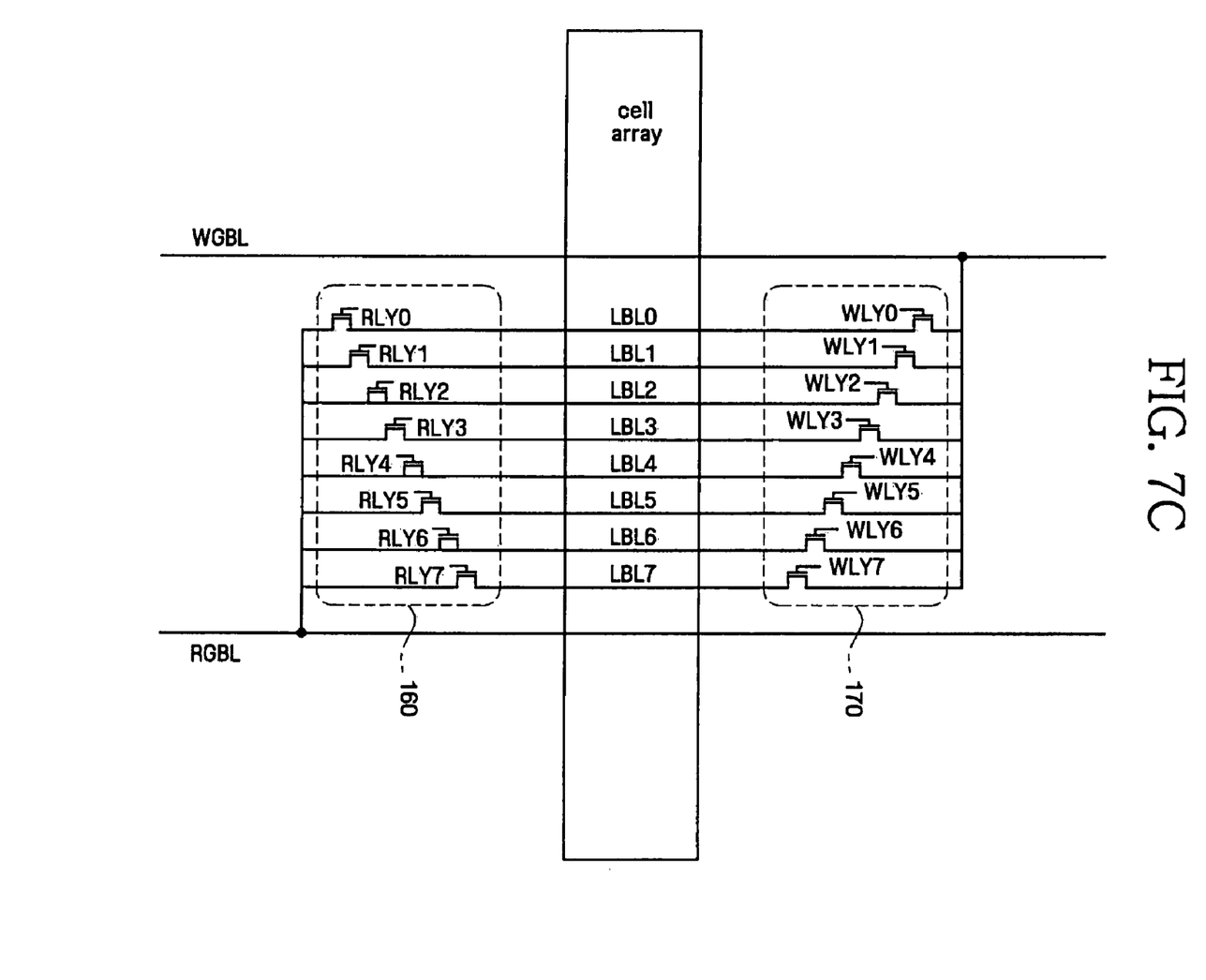
Figure 7D:
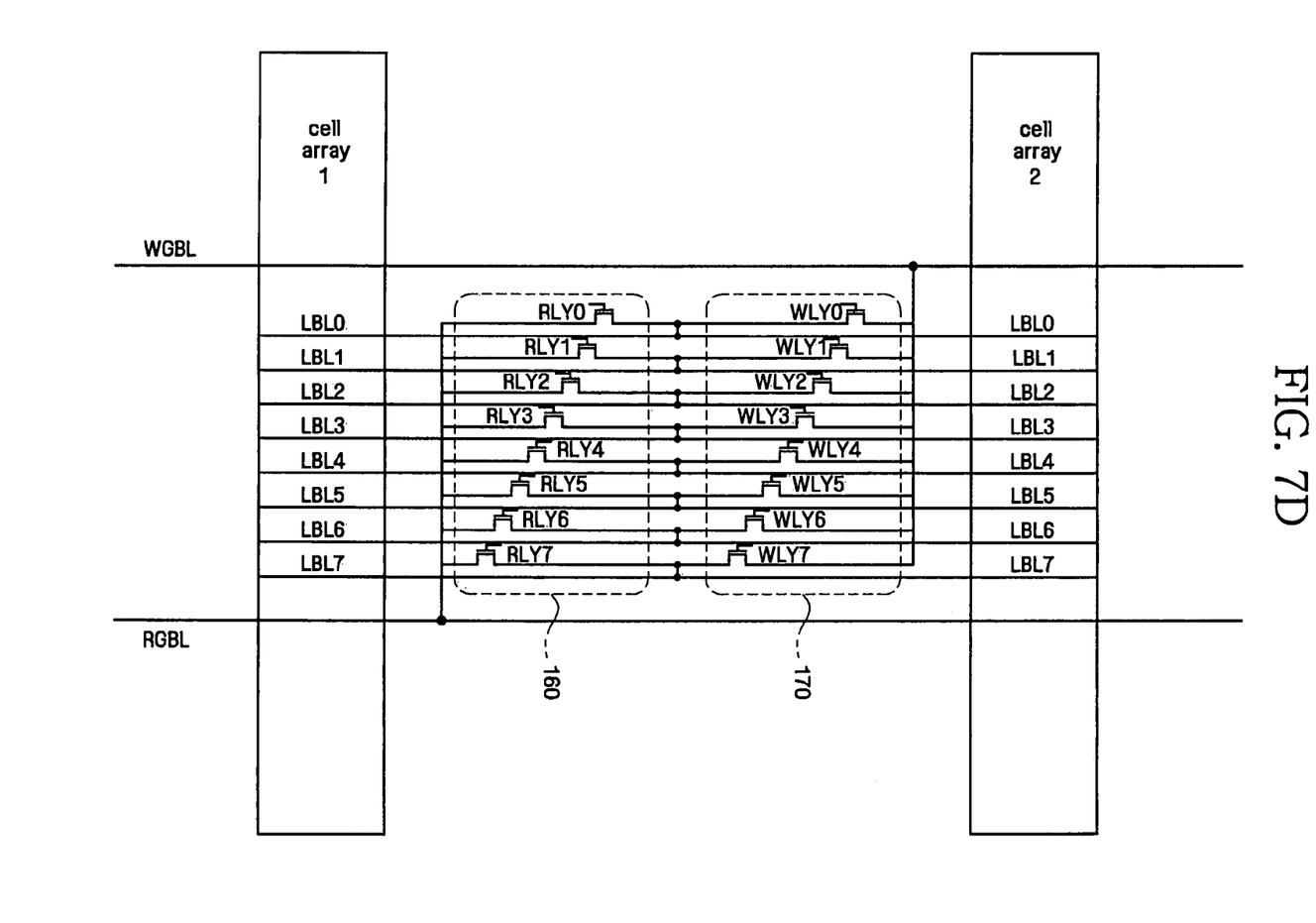

Referring to FIGS. 7A-7D, the local column select circuit 155 of FIG. 5 includes write local column select circuit(s) (170_1 and 170_2 in FIG. 7A or 7B, or 170 in FIG. 7C or 7D) and read local column select circuit(s) (160_1 and 160_2 in FIG. 7A or 7B, or 160 in FIG. 7C or 7D). The write local column select circuit(s) couple(s) local bit lines LBL0 through LBL7 with a write global bit line WGBL in response to write local select signals WLY0 through WLY7 during a write operation. The read local column select circuit(s) couple(s) the local bit lines LBL0 through LBL7 with a read global bit line RGBL in response to read local select signals RLY0 through RLY7 during read operation. A memory cell array includes a plurality of nonvolatile memory cells located within the sub-blocks (S0 through S7 in FIG. 4) and coupled with the local bit lines LBL0 through LBL7.

As shown in the embodiment of FIG. 7A, the write local column select circuits 170_1 and 170_2 are disposed on either side of a cell array. Each of the write local column select circuits 170_1 and 170_2 includes a plurality of selection transistors corresponding in number to the local bit lines of the cell array. Each selection transistor is connected between the write global bit line WGBL and a respective one of the local bit lines LBL0 through LBL7; and receives a respective one of the write local select signals WLY0 through WLY7. The read local column select circuits 160_1 and 160_2 are also disposed on either side of the cell array. However the read local column select circuit 160_1 only includes selection transistors corresponding to even numbered ones of the local bit lines, while the read bit column select circuit 160_2 includes selection transistors corresponding the odd numbered local bit lines. In particular, the selection transistors of the read local column select circuit 160_1 are connected between the read global bit line RGBL and a respective one of the local bit lines LBL0, LBL2, LBL4, and LBL6; and receive the read local select signals RLY0, RLY2, RLY4, RLY6 respectively at their gates. The read local column select circuit 160_2 includes selection transistors connected between the read global bit line RGBL and the local bit lines LBL1, LBL3, LBL5, and LBL7 and receive the read local select signals RLY1, RLY3, RLY5, and RLY7 at their gates.

In the embodiment of FIG. 7B, the write local column select circuits 170_1 and 170_2 are disposed on either side of the cell array. Each of these write local column select circuits includes selection transistors for half of the local bit lines in the cell array. In particular, the write local column select circuit 170_1 includes selection transistors connected between the write global bit line WGBL and the local bit lines LBL0, LBL2, LBL4, and LBL6; and these selection transistors receive the write local select signals WLY0, WLY2, WLY4, and WLY6 respectively at their gates. The write local column select circuit 170_2 includes selection transistors connected between the write global bit line WGBL and the local bit lines LBL1, LBL3, LBL5, and LBL7; and the selection transistors receive the write local select signals WLY1, WLY3, WLY5, and WLY7 respectively at their gates. In this embodiment the read local column select circuits 160_1 and 160_2 are disposed on either side of the cell array. Both of the read local column select circuits 160_1 and 160_2 include selection transistors associated with each local bit line. In particular, these read local column select circuits include selection transistors connected between the read global bit line RGBL and a respective one of the local bit lines LBL0 through LBL7. The selection transistors also respectfully receive the read local selection signals RLY0 through RLY7 at their gates.

In the embodiment of FIG. 7C, a single read local column select circuit 160 is disposed on one side of the cell array, while a single write local column select circuit 170 is disposed on the other side of the cell array. The write local column select circuit 170 is the same as the write local column select circuit 170_2 in FIG. 7A, and the read column select circuit 160 is the same as the read column select circuit 160_1 in FIG. 7B.

As will be appreciated from the above discussion, the arrangements discussed above with respect to FIGS. 7A-7C are repeated for each cell array. With respect to the embodiment of FIG. 7D, this embodiment is repeated for each pair of cell arrays. In FIG. 7D, examples cell arrays 1 and 2 are illustrated. These cell arrays share local bit lines LBL0-LBL7. A write local column select circuit 170 and a read local column select circuit 160 are disposed between the cell arrays 1 and 2. Each of the write local column select circuit 170 and the read local column select circuit 160 includes selection transistors equal in number to the local bit lines in the associated portion of the cell arrays 1 and 2. In particular, the read local column select circuit 160 includes selection transistors connected between the read global bit line RGBL and the local bit lines LBL0 through LBL7, and the selection transistors receive the read local select signals RL0 through RL7 respectively at their gates. Similarly, the selection transistors in the write local select circuit 170 are connected between the write global bit line WGBL and the local bit lines LBL0 through LBL7, and the selection transistors respectfully receive the write local select signals WLY0 through WLY7.

The write and read local column select circuits may have various other configurations than those illustrated in FIGS. 7A-7D.

Figure 8A:
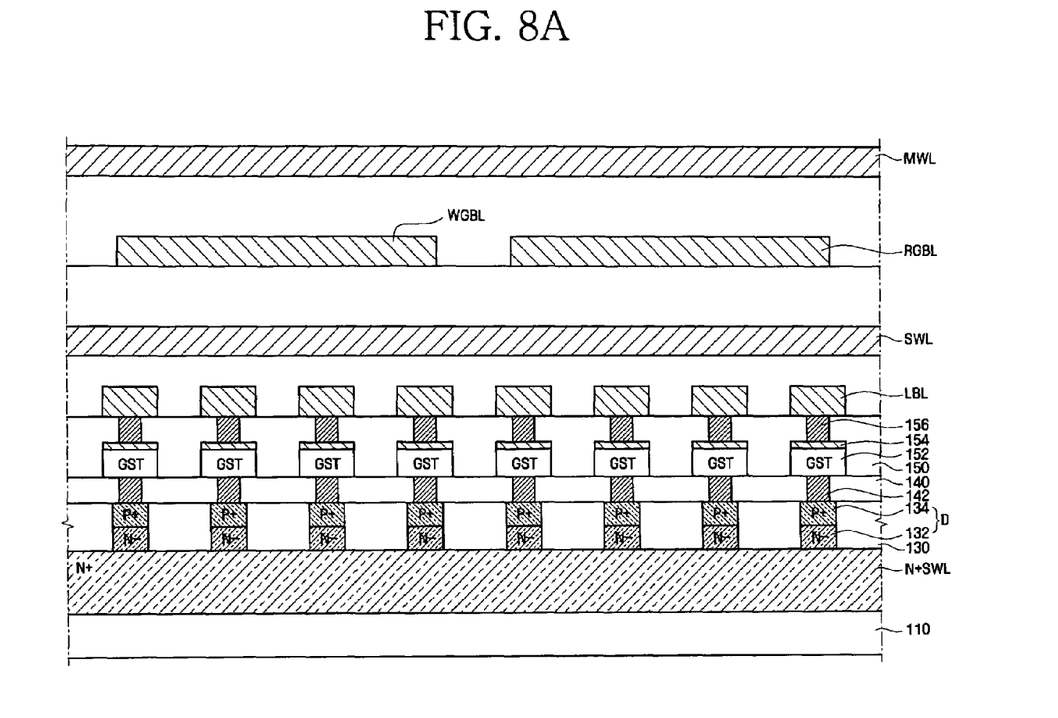
FIGS. 8A and 8B are exemplary cross-sections of a nonvolatile memory device according to an embodiment of the present invention.
Figure 8B:
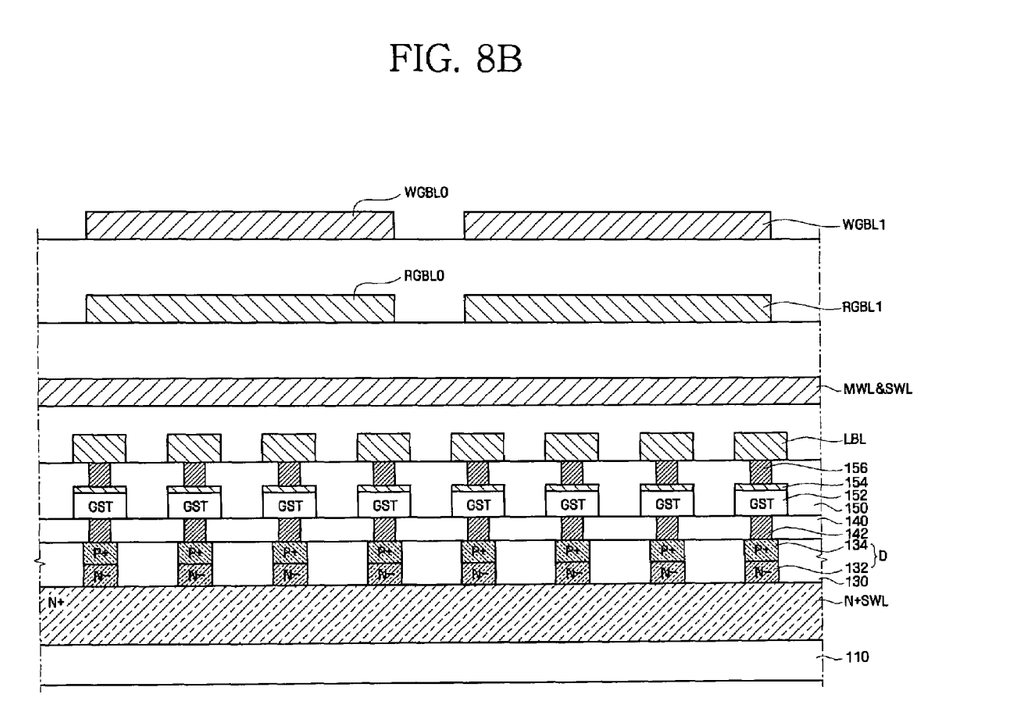

FIGS. 8A and 8B are exemplary cross-sections of nonvolatile memory devices according to embodiments of the present invention.

Referring to FIGS. 8A and 8B, the nonvolatile memory device according to the present embodiment includes a P-type semiconductor substrate 110 having an active region defined by forming a device isolation region thereon.

An N+ type sub word line N+SWL is formed within the semiconductor substrate 110.

A first insulating layer 130 is formed on the semiconductor substrate 110. A plurality of cell diodes D consisting of N– and P+ type semiconductor patterns 132 and 134 are formed in the first insulating layers 130 in contact with the N+ type sub word line N+SWL.

A second insulating layer 140 is formed over the first insulating layer 130 and a plurality of bottom electrode contacts (BECs) 142 are formed in the second insulating layer 140. Each BEC 142 contacts a respective one of the cell diodes D.

A plurality of variable resistive materials 152 are formed on the second insulating layer 140 so as to be coupled with the plurality of BECs 142, and a plurality of top electrode contacts (TECs) 154 are formed on the plurality of variable resistive materials 152.

The nonvolatile memory device further includes a third insulating layer 150 formed on the second insulating layer 140 and having a plurality of bit line contacts 156 respectively coupled with the plurality of TECs 154. A plurality of local bit lines LBLs are formed above the third insulating layer 150 and are respectively coupled with the plurality of bit line contacts 156. An insulating layer 160 is formed over the plurality of both lines LBL.

With reference to FIG. 8A, a sub word line SWL is formed over the plurality of local bit lines LBLs on the insulating layers 160. An insulating layer 170 is formed over the sub word line SWL. A write global bit line WGBL and a read global bit line RGBL are formed over the sub word line SWL on the insulating layer 170. An insulating layer 180 is formed over the read global bit line RGBL and the write global bit line WGBL. A main word line MWL is formed over the write global bit line WGBL and the read global bit line RGBL on the insulating laser 180. Although not shown in FIG. 8A, the sub word line SWL is coupled with the N+-type sub word line N+SWL formed within the semiconductor substrate 110.

Further, the write global bit line WGBL and the read global bit line RGBL are selectively coupled with the plurality of local bit lines LBLs (8 LBLs in FIG. 8A). In particular, FIG. 8A shows an example in which the write global bit line WGBL and the read global bit line RGBL are located at the same level. Furthermore, although not shown in FIG. 8A, the main word line MWL is selectively coupled with the sub word line SWL.

FIG. 8B shows an example of a nonvolatile memory device in which write global bit lines WGBL0 and WGBL1 are located at a different level than read global bit lines RGBL0 and RGBL1. Referring to FIG. 8B, the main and sub word lines MWL and SWL are formed on the insulating layer 160. An insulating layer 170' is formed over the main and sub word lines MWL and SWL. Respective first and second read global bit lines RGBL0 and RGBL1 are formed on the insulating layer 170', and another insulating layer 180' is formed over the first and second read global bit lines RBGL1 and RGBL2. The write global bit lines WGBL0 and WGBL1 may be formed above the read global bit lines RGBL0 and RGBL1 on the insulating layer 180'. Although not shown in FIG. 8B, the read and write global bit lines RGBL0 and WGBL0 are selectively coupled with a plurality of local bit lines LBLs (the left four LBLs in FIG. 8B) while the read and write global bit lines RGBL1 and WGBL1 are selectively coupled with a remaining plurality of local bit lines LBLs (the right four LBLs in FIG. 8B). The read and write global bit lines RGBL0 and RGBL1 and WGBL0 and WGBL1 may be coupled with the plurality of local bit lines LBLs in various other ways. Furthermore, while FIG. 8B shows the main word line MML and the sub word line SWL are formed at the same level, they may be arranged in other ways. For example, the main word line MWL may be formed above the write global bit lines WGBL0 and WGBL1.

As described above, the present invention provides a nonvolatile memory device with a reduced size of core architecture.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nonvolatile memory device comprising:
   a plurality of memory banks, each of which includes a plurality of nonvolatile memory cells, each cell including a variable resistive element having a resistance varying depending on stored data;
   a plurality of global bit lines, each global bit line being shared by the plurality of memory banks and including a write global bit line used to write data into the plurality of memory banks and a read global bit line used to read data from the plurality of memory banks;
   a plurality of main word lines, each main word line arranged corresponding to one of the plurality of memory banks;
   at least one set of local bit lines, each set of local bit lines associated with the memory cells of at least one of the memory banks;
   at least one write local column select circuit associated with each set of local bit lines, and coupling at least a portion of the set of local bit lines with one of the write global bit lines during a write operation; and
   at least one read local column select circuit associated with each set of local bit lines, and coupling at least a portion of the set of local bit lines with one of the read global bit line during a read operation,
   wherein first and second write local column select circuits are located on respective sides of an array of the memory cells, first and second read local column select circuits are located on respective sides of the memory cell array, and one of the first write local column select circuit and the first read local column select circuit includes selection transistors for half of the local bit lines in the cell array.

2. The device of claim 1, wherein
   at least one memory bank includes first and second memory cell arrays sharing the local bit lines; and
   the write local column select circuit and the read local column select circuit are located between the first and second memory cell arrays.

3. The device of claim 1, wherein each of the plurality of memory banks includes a plurality of sub-blocks, each sub-block having a plurality of nonvolatile memory cells.

4. The device of claim 3, wherein when n and m are integers greater than 1, and the global bit lines and main word lines are configured such that m sets of data are simultaneously written to n sub-blocks during a test operation so as to write n×m sets of data.

5. The device of claim 3, wherein when n and m are an integers greater than 1, and the global bit lines and main word lines are configured such that m sets of data are repeatedly written n times into one sub-block during a normal operation so as to write n×m sets of data.

6. The device of claim 1, further comprising:
   a global write driver circuit and/or sense amplifier circuit that is coupled with the plurality of global bit lines, the global write driver circuit and/or sense amplifier circuit writing data into the plurality of memory banks through the plurality of global bit lines and reading data from the plurality memory banks through the plurality of global bit lines.

7. The device of claim 1, further comprising:
   a main decoder coupled with the plurality of main word lines and selecting the plurality of main word lines, each main word line being arranged corresponding to one of the plurality of memory banks.

8. The device of claim 1, further comprising:
   a redundancy memory cell array shared by the plurality of memory banks.

9. The device of claim 1, wherein the nonvolatile memory cells are phase-change memory cells.

10. A nonvolatile memory device comprising:
    a plurality of memory banks, each of which includes a plurality of nonvolatile memory cells, each cell including a variable resistive element having a resistance varying depending on stored data;
    a plurality of write global bit lines that are used to write data into the plurality of memory banks;
    a plurality of read global bit lines that are used to read data from the plurality of memory banks;
    a global write driver and/or sense amplifier circuit coupled with the plurality of write global bit lines and the plurality of read global bit lines;
    at least one set of local bit lines, each set of local bit lines associated with the memory cells of at least one of the memory banks;
    at least one write local column select circuit associated with each set of local bit lines, and coupling at least a portion of the set of local bit lines with one of the plurality of write global bit lines during a write operation; and
    at least one read local column select circuit associated with each set of local bit lines, and coupling at least a portion of the set of local bit lines with one of the plurality of read global bit lines during a read operation,
    wherein first and second write local column select circuits are located on respective sides of an array of the memory cells, first and second read local column select circuits are located on respective sides of the memory cell array, and one of the first write local column select circuit and the first read local column select circuit includes selection transistors for half of the local bit lines in the cell array.

11. The device of claim 10, wherein each of the plurality of write global bit lines and each of the plurality of read global bit lines are shared by the plurality of memory banks.

12. The device of claim 10, wherein each of the plurality of memory banks includes a plurality of sub-blocks, each sub-block having the plurality of nonvolatile memory cells.

13. The device of claim 12, wherein when n and m are integers greater than 1, and the global bit lines and main word lines are configured such that m sets of data are simultaneously written into n sub-blocks during test operation so as to write n×m sets of data.

14. The device of claim 12, wherein when n and m are integers greater than 1, and the global bit lines and main word lines are configured such that m sets of data are repeatedly written n times into one sub-block during normal operation so as to write n×m sets of data.

15. The device of claim 10, further comprising:
a redundancy memory cell array shared by the plurality of memory banks.

16. The device of claim 10, wherein the nonvolatile memory cells are phase-change memory cells.

17. A nonvolatile memory device comprising:
a semiconductor substrate;
a plurality of local bit lines formed above the semiconductor substrate and coupled with a plurality of phase-change memory cells;
a write global bit line and a read global bit line formed above the plurality of local bit lines and selectively coupled with the plurality of local bit lines;
at least one write local column select circuit associated with the plurality of local bit lines, and coupling one of the local bit lines with the write global bit line during a write operation; and
at least one read local column select circuit associated with the plurality of local bit lines, and coupling one of the local bit lines with the read global bit line during a read operation,
wherein first and second write local column select circuits are located on respective sides of an array of the memory cells, first and second read local column select circuits are located on respective sides of the memory cell array, and one of the first write local column select circuit and the first read local column select circuit includes selection transistors for half of the local bit lines in the cell array.

18. The device of claim 17, wherein the write global bit line and the read global bit line are located at a same level.

19. The device of claim 17, wherein the write global bit line is located at a different level than the read global bit line.

\* \* \* \* \*